United States Patent [19]

Welch

[11] 4,151,325
[45] Apr. 24, 1979

[54] TITANIUM NITRIDE THIN FILMS FOR MINIMIZING MULTIPACTORING

[75] Inventor: Kimo M. Welch, Mountain View, Calif.

[73] Assignee: The United States of America as represented by the United States Department of Energy, Washington, D.C.

[21] Appl. No.: 734,841

[22] Filed: Oct. 22, 1976

Related U.S. Application Data

[62] Division of Ser. No. 565,019, Apr. 3, 1975, Pat. No. 4,006,073.

[51] Int. Cl.$^2$ ............................................. H01J 43/28
[52] U.S. Cl. ................................... 428/432; 313/107; 315/5; 204/192 SP; 427/78; 427/126; 427/248 B; 427/109; 427/248 R; 427/255
[58] Field of Search .................... 313/106, 107; 315/5; 427/78, 109, 419 F, 126, 248 B, 248 R; 252/520; 106/299; 204/192 SP; 333/99 MP; 428/432

[56] References Cited

U.S. PATENT DOCUMENTS

| 3,309,302 | 3/1967 | Heil | 313/107 |
| 3,891,884 | 6/1975 | Tisdale | 313/107 |

FOREIGN PATENT DOCUMENTS 773702  5/1957  United Kingdom .................... 427/248

*Primary Examiner*—Ralph S. Kendall
*Attorney, Agent, or Firm*—Dean E. Carlson; R. S. Gaither; Clifton E. Clouse, Jr.

[57] ABSTRACT

Applying a thin film coating to the surface of a workpiece, in particular, applying a coating of titanium nitride to a klystron window by means of a crossed-field diode sputtering array. The array is comprised of a cohesive group of numerous small hollow electrically conducting cylinders and is mounted so that the open ends of the cylinders on one side of the group are adjacent a titanium cathode plate. The workpiece is mounted so as to face the open ends of the other side of the group. A magnetic field is applied to the array so as to be coaxial with the cylinders and a potential is applied across the cylinders and the cathode plate, the cylinders as an anode being positive with respect to the cathode plate. The cylinders, the cathode plate and the workpiece are situated in an atmosphere of nitrogen which becomes ionized such as by field emission because of the electric field between the cylinders and cathode plate, thereby establishing an anode-cathode discharge that results in sputtering of the titanium plate. The sputtered titanium coats the workpiece and chemically combines with the nitrogen to form a titanium nitride coating on the workpiece. Gas pressure, gas mixtures, cathode material composition, voltages applied to the cathode and anode, the magnetic field, cathode, anode and workpiece spacing, and the aspect ratio (ratio of length to inner diameter) of the anode cylinders, all may be controlled to provide consistent optimum thin film coatings of various compositions and thicknesses. Another facet of the disclosure is the coating of microwave components per se with titanium nitride to reduce multipactoring under operating conditions of the components.

4 Claims, 9 Drawing Figures

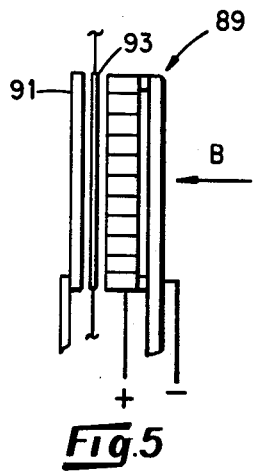
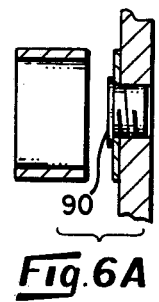
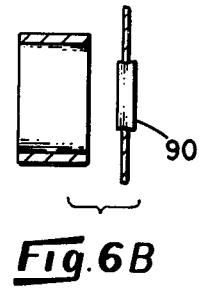
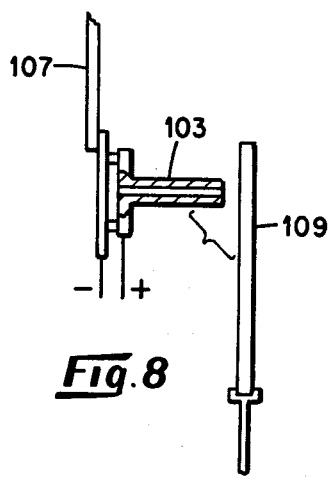
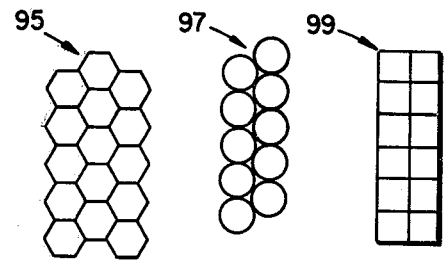
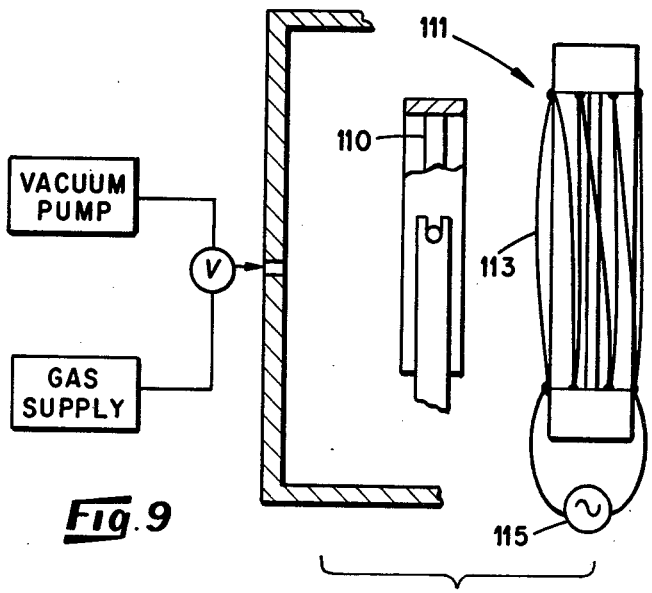

TITANIUM NITRIDE THIN FILMS FOR MINIMIZING MULTIPACTORING

BACKGROUND OF THE INVENTION

The invention disclosed herein was made under, or in, the course of ERDA Contract No. AT(04-3)-515 with Stanford University.

This is a division of application Ser. No. 565,019, filed Apr. 3, 1975, now U.S. Pat. No. 4,006,073, issued Feb. 1, 1977.

The present invention relates to the use of crossed electric and magnetic fields in a cathode-anode diode sputtering array for deposition of a thin film on a workpiece, and more particularly, it relates to mounting the workpiece in a position in which the workpiece is outside the space for discharge between the anode and cathode and it further relates to coating a microwave component with titanium nitride to reduce multipactoring.

Thin film deposition by sputtering within crossed electric and magnetic fields has been proposed before and various arrangements of cathodes and anodes are known in the art, for example the arrangements disclosed in U.S. Pat. No. 2,146,025, issued Feb. 7, 1939, to F. M. Penning, and the arrangement suggested by L. Holland in his book (*Vacuum Deposition of Thin Films*, John Wiley and Sons, New York, 1958, pages 411 and 412). However, the workpiece in these prior arrangements has been placed in a position in which the workpiece is within the cathode-anode discharge space and/or has the cathode or anode potential applied to the workpiece, thereby subjecting the workpiece to excessive ion bombardment, both positive and negative, and high electrical field stresses which usually cause puncturing of the workpiece; and it is very difficult in these prior arrangements to prevent such puncturing. Other problems encountered with the prior art arrangements include difficulty in controlling the thickness and uniformity of the deposition.

SUMMARY OF THE INVENTION

In brief, the present invention relates to apparatus for applying a thin film coating to a workpiece and includes a cathode comprised of a sputtering material; an anode between the workpiece and cathode, with the anode having a passage with one end opening towards the cathode and the opposite end opening towards the workpiece; means for providing an ionizable gas around the cathode and anode; means for establishing an electric field between the cathode and anode sufficient to sustain an electrical discharge therebetween through the gas; means for establishing a magnetic field to extend throughout the space around the anode and cathode; and means for mounting the workpiece outside the space of discharge between the anode and cathode. During the discharge, the gas is ionized and the resulting positive ions are accelerated towards the cathode to impinge thereon to sputter particles towards the workpiece to coat the workpiece. With the workpiece outside the discharge space, there is a degree of positive ion bombardment that is sufficient to clean the workpiece to enhance the adherence of the coating but insufficient to cause puncturing and excessive heating of the workpiece. Moreover, with the workpiece outside the discharge space, the uniformity, thickness, and rate of coating may be precisely controlled without deterioration of the workpiece by ion bombardment.

Another aspect of the invention is coating microwave components specifically with titanium nitride by any type of coating apparatus to reduce mutlipactoring under operating conditions of the components.

It is therefore an object of the invention to use crossed magnetic and electric fields to coat a workpiece by means of sputtered material without deterioration of the workpiece.

Another object is to coat films of various thicknesses onto various surfaces and materials simply and inexpensively.

Another object is to deposit a thin film coating rapidly, uniformly and of precise thickness on a workpiece.

Another object is to simultaneously clean a workpiece by means of ion bombardment and to coat the workpiece by means of sputtered material without deterioration of the workpiece.

Another object is to provide an improved means for sputtering a thin film pattern onto a substrate such as for manufacturing printed circuit boards, for depositing thin film coatings for solder connections, and for coating irregular surfaces.

Another object is to coat portions of radio-frequency microwave components (klystron windows in particular) with titanium nitride to reduce multipactoring.

Other objects and advantageous features of the invention will be apparent in a description of a specific embodiment thereof, given by way of example only, to enable one skilled in the art to readily practice the invention which is described hereinafter with reference to the accompanying drawings.

BRIEF DESCRIPTION OF THE DRAWINGS

FIG. 5 is a diagram of a crossed-field diode sputtering arrangement in which a mask is used to form a thin film pattern on a workpiece;

FIG. 6 is a cross-sectional view of two crossed-field diodes, each having an insert of sputtering material in the cathode element of the diode;

FIG. 7 is a front view of various representative anode configurations;

FIG. 8 is a diagram of a crossed-field diode arrangement for depositing a thin film line on a workpiece; and FIG. 9 is an arrangement including a titanium filament in a nitrogen atmosphere for depositing a thin film of titanium nitride on a microwave component.

DESCRIPTION OF AN EMBODIMENT

Figure 1:
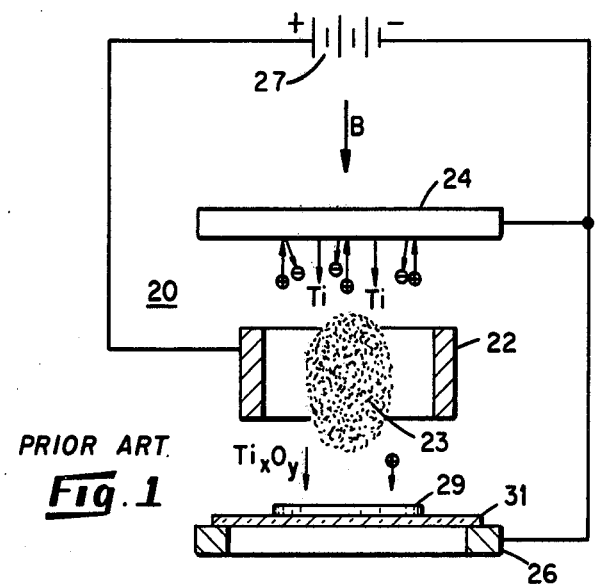
FIG. 1 is a diagram of a prior art crossed-field sputtering arrangement for depositing a thin film on a workpiece.

Referring to the drawing there is shown in FIG. 1 a prior art arrangement including a cell 20 for sustaining an electric discharge within crossed electric and magnetic fields. Such a cell is described by L. Holland in his book *Vacuum Deposition of Thin Films* referred to hereinbefore. The cell 20 is comprised of a hollow cylinder 22 shown in cross section, as an anode, and a first cathode 24 shown as a plate having a plane surface opposite one end of the cylinder, and a second cathode 26 shown in cross section as an annular ring mounted opposite and coaxial with the other end of the cylinder. A voltage source 27 is provided to supply a positive potential to the anode 22 and a negative potential to the cathodes 24 and 26. A magnetic field B is applied to the cell 20 in a direction that is coaxial with the anode cylinder to extend throughout the space in which the diode is mounted. The atmosphere in which the diode is mounted is at a very low pressure and is an ionizable gas.

In operation of the cell 20, the gas is subject to electric fields by means of the source 27 being connected across the anode 22 and cathodes 24 and 26. Ionization of the gas is self-initiating and no additional electron source is required. A stray electron may be generated by a cosmic particle, or be emitted by field emission. The stray electron, because of the magnetic field, is caused to follow a long complex spiralling path generally within the anode 22 to collide with and ionize other gas molecules. Each positive ion stemming from this ionization process is accelerated by the electric field towards one of the cathodes. Upon impinging on the cathode 24, each positive ion (under steady-state discharge conditions) liberates an electron from the cathode. The liberated electron is then accelerated by the electric field back to the interior of the cylinder 22 to form a cloud 23 of electrons that spiral back and forth for further collision with and ionization of the gas molecules. Positive ions are also accelerated towards the cathode 26 with some impinging on a workpiece 29 which is resting on a supporting member 31 such as a glass plate. Bombardment of the cathode 24 with positive ions causes it to sputter particles of cathode material which are thereby projected towards the workpiece for coating it. The sputtered material combines with active gases in the cell 20 to form neutral compounds as a coating for the workpiece 29.

The rate of coating the workpiece 29 and the thickness of the coating can be controlled by variation of the spacing between the cathodes 24 and 26 and the anode 22 and the workpiece 29, by variation in the composition and pressure of the gas, by variation of the magnetic field strength and the voltage applied across the anode and cathodes and thereby the current density therebetween. However, one main disadvantage of the prior art arrangement 20 is that it is very difficult to prevent deterioration of the workpiece due to severe bombardment of the workpiece by positive ions and the consequent charge buildup between the cathode 26 and workpiece surface on which the positive ions impinge. The charge buildup often causes discharge through the workpiece, resulting in puncturing of the workpiece and thus its practical destruction.

Figure 2:
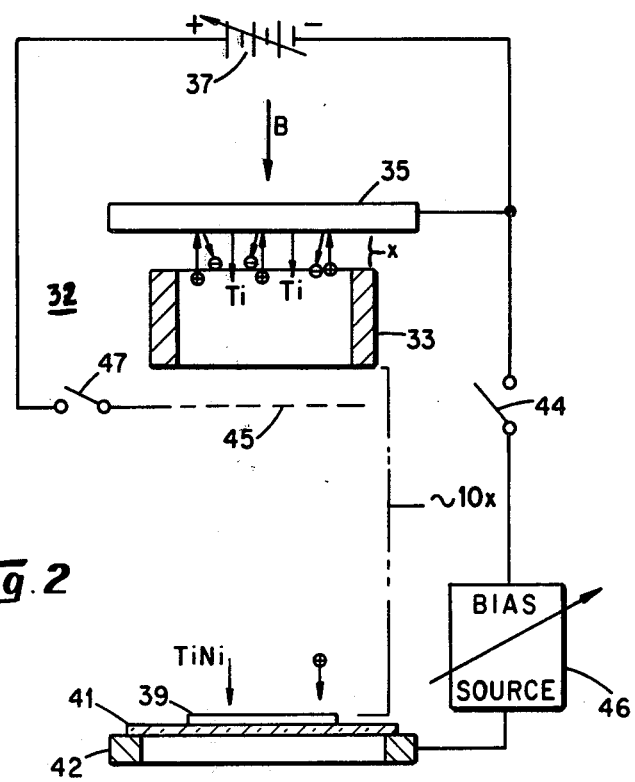
FIG. 2 is a diagram of a basic crossed-field diode sputtering arrangement for depositing a thin film on a workpiece according to the invention.

One important feature of the present invention is the placement of a workpiece outside the discharge volume of a crossed-field discharge device. This may be done by mounting the workpiece on a holder that is not connected to the electrical circuit of the device and may be accomplished according to the invention by means of a diode arrangement 32 (FIG. 2) including a cylindrical anode 33, a cathode 35 at one end of the anode, a voltage source 37 across the anode and cathode, and a substrate or workpiece 39 mounted on supporting members 41 and 42 that may be electrically isolated from the source 37 and far removed from the discharge volume which is maintained in and about the anode 33. The source 37 may be either DC as shown or AC (not shown). It has been found that deterioration of the workpiece due to ion bombardment has been substantially eliminated in the arrangement 32, yet there is sufficient ion bombardment to clean the workpiece to enhance the adherence of the coating. Moreover, it has been further found that there is a very high degree of control over the coating thickness, down to one molecular layer and a high degree of control over the rate of coating. Even greater control of ion bombardment may be had by provision of a switch 44 and a bias source 46 serially connected with the negative terminal of the source 37. With the switch 44 closed, the bias source 46 may be adjusted to control the degree of ion bombardment by application of any desired range of negative or positive voltages. If the bias source 46 is adjusted to hold the supporting member 42 around the potential of the anode 33 for optimum ion bombardment, it is desirable in order to avoid disruption of the electric field in the region of the anode to space the workpiece 39 on the order of ten times the spacing between the anode 33 and cathode 35. Since such spacing prevents alteration or disruption of the electric field, the discharge intensity remains symmetrical to provide better uniformity of coating and to permit relative movement between substrate and anode to uniformly coat larger areas.

The apparatus 32 is operated in a high-vacuum environment and the rate of sputtering is directly proportional to, among other parameters, the gas pressure of the environment. Operation of the apparatus 32 is below the range in pressure which is commonly referred to as the glow discharge region. The pressure in the region of the electrical discharge may be as high as $1 \times 10^{-3}$ Torr, but also may be as low or lower than $10^{-12}$ Torr, depending upon the desired sputtering rate.

Generally, the cathode 35 may include as sputtering material all of the metals, dielectrics, semiconductors, and other chemical compounds including oxides and nitrides of metals, and alloys. The substrate may include all of the metals and conductors such as copper, gold, iron, aluminum, and all metallic alloys, all forms of semiconductors, dielectrics such as aluminum oxide, beryllium oxide, and various forms of ceramic and glass, and materials such as wood, various fabrics and cloth, elastomers, and man-made materials such as Teflon, Bakelite, and other such plastics, and all forms of paper. The only practical limitation to a material elected as a possible substrate is that it not volatilize as the result of the vacuum environment.

A swirling electron space-charge cloud, such as discussed in relation to the cell 20, also exists near and within the volume of the anode 33. This electron space-charge cloud is trapped in the region of the volume by the magnetic field B which has a magnetic field vector pointing in a direction nearly parallel to the central axis of the anode 33. However, the magnetic field vector may depart from parallel orientation with the central axis by as much as 30° without significant effects. Moreover, it is not necessary for the magnetic field to extend beyond the region of the anode to the surface being coated. Since there is no need for electric or magnetic field shaping elements or electrodes in proximity to the surface being coated, electrical insulation materials may be effectively coated by this process thereby exemplifying the independence of the substrate from being part of the electrical or magnetic circuits.

Due to the existence of a space-charge cloud about the anode 33, the anode volume may be electrically negatively depressed to the point of operating near cathode potential. The degree of potential depression depends on the magnetic field, pressure, and the cell aspect ratio. The potential depression results in a radial force on the electrons within the anode in a direction near normal to the central axis of the anode. This force initially accelerates the electrons in this near normal direction, but due to the "Lorentz" force on the electrons caused by the magnetic field, the electrons are forced into spiraling orbits, experiencing extremely long path lengths prior to reaching the anode or being deflected by elastic or ionizing collisions, escaping the anode volume as a result of these collisions with gas molecules. Positive ions which are created as a consequence of the electron collisions within or near the anode volume are drawn to the cathode 35 or are accelerated away from the anode 33. These ions and additional ions which may have been reflected off of the cathode 35 form an ion beam which is launched in a direction favoring the open end of the anode opposite cathode 35. The high-energy ions which strike the surface of the cathode 35 result in the sputtering of cathode material which in turn is deposited onto the substrate 39 as discussed hereinbefore. Ions in the beam, having kinetic energies nearly equivalent to that of the maximum potential drop between the anode and the cathode, to on the order of a few electron volts, have a trajectory on leaving the gun array which may be affected by the fringing magnetic field near the anode and the space charge spreading effects within the beam. Thus the intensity of the ion beam impinging on the substrate 39 may be altered by the geometry of the anode 33, the cathode to anode potential, the magnetic field intensity, the relative alignment of the magnetic field with the anode axis, gas pressure, the orientation of the normal vector from the anode 33 and spacing of the anode from the substrate. Also a grid electrode 45 preferably of the same material as the cathode and held at anode potential through a switch 47 may be used to more completely isolate the substrate 39 from ion bombardment, but the use of such a grid is generally not necessary. As mentioned hereinbefore the ion beam has the beneficial effect of "scrubbing" or cleaning the surface of the material to be coated, removing unwanted surface gas and contaminates to assure excellent surface bonding of the coated film to this surface. An advantage of this technique is that there is control of the degree of ion scrubbing of the substrate surface and heating of the substrate by appropriate choice of anode configuration, magnetic field, electric potential, and pressure. An example of such an application would be the use of a high-power ion beam to first clean off inherent aluminum oxide on an aluminum surface, then the subsequent sputtering of silver, copper, or other material onto the surface for subsequent joining applications.

When an inert gas is used to sustain a discharge, material sputtered from the cathode 35 will retain its chemical integrity when deposited on the substrate 39. If the cathode is a pure material and the sputtering medium a pure inert gas, the substrate film will be pure. On the other hand, various compounds may be formed by appropriate selection of cathode material and sputtering gas. For example, titanium nitride may be formed on a substrate by using titanium as a cathode material and nitrogen as the sputtering gas. This may be accomplished most successfully in the deposition of a titanium nitride film onto aluminum oxide substrates for purposes of suppressing secondary electron emission from microwave component surfaces. Oxides of aluminum and titanium may also be formed on substrates by using aluminum or titanium as a cathode and oxygen as the sputtering gas. Lubricants also may be sputtered onto surfaces by using, for example, molybdenum as the cathode material and hydrogen sulfide, for example, as the sputtering gas.

The purity of the film coating depends on the type of material and sputtering gas. Unlike rf sputtering systems, the discharge is maintained in a local region so that unwanted heating and gas desorption are minimized or completely eliminated. The minimal gas desorption problems inherent in crossed-field sputtering reduces costs of supportive vacuum equipment substantially. The substrate and other associated equipment may be kept cool as heating due to thermal radiation as in the case of coating with an evaporation source, or heating due to an rf plasma cloud or possible rf loss tangent heating effects do not occur.

Figure 3:
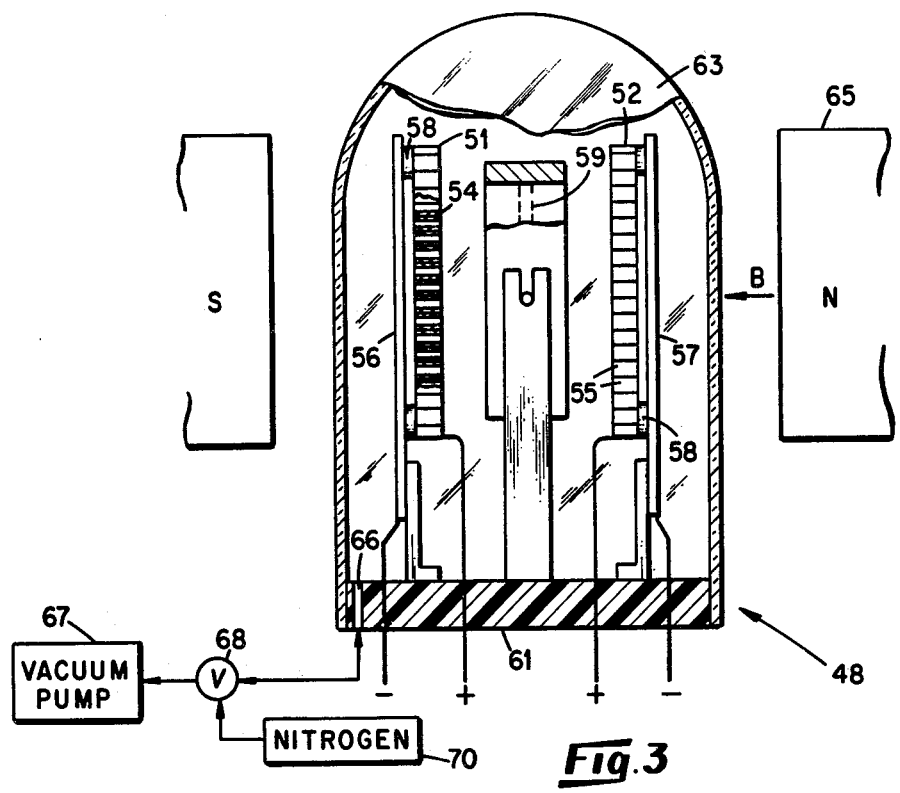
FIG. 3 is a diagram of a crossed-field diode sputtering arrangement for depositing a thin film on a workpiece having a large surface area.

In order to coat large surface areas on opposite sides of a workpiece simultaneously, a multiple cell dual diode array arrangement 48 (FIG. 3) may be used. The array 48 is comprised of anodes 51 and 52, each respectively made up of a honeycomb array of cells 54 and 55 which are connected together such as by brazing and have central passages with one end opposing respective cathode plates 56 and 57 but separated therefrom by electrical insulation spacers 58. A klystron window 59 as a workpiece is centrally located between the anodes 51 and 52 for receiving a thin film coating. The anodes, cathodes and workpiece are mounted on a base 61 and enclosed by means of a bell jar 63. A magnet 65, which may be a permanent magnet or an AC or DC electromagnet, is mounted with the bell jar in its gap so as to provide a magnetic field that is coaxial with the passages in the anodes 51 and 52 and so as to extend throughout the space of operation of the multiple cell dual diode 48.

Prior to coating the window 59, the space within the bell jar 63 is evacuated by means of a vacuum pump 67 acting through a valve 68 and a passage 66 in the base 61. The evacuated space may be then supplied with a gas such as from a nitrogen source 70. Other gases such as oxygen or mixtures of gases such as oxygen or nitrogen with argon may also be used.

In operation of the multiple cell dual diode 48, the gas in the bell jar 63 is ionized in the manner discussed hereinbefore with respect to the arrangement 32 (FIG. 2) and results in both sides of the window 59 being bombarded with ions to clean the window surfaces. The cathodes 56 and 57 are also bombarded with ions, causing the cathodes to release electrons to increase the ionization of the gas in the bell jar and to sputter cathode material to coat the klystron window surfaces. The sputtered cathode material combines with the gas in the bell jar 63; and in the case of titanium cathode material and nitrogen gas, the titanium combines with the nitrogen to form titanium nitride as a coating for the window, while if argon is present, argon being a noble gas, does not combine with the titanium.

Figure 4:
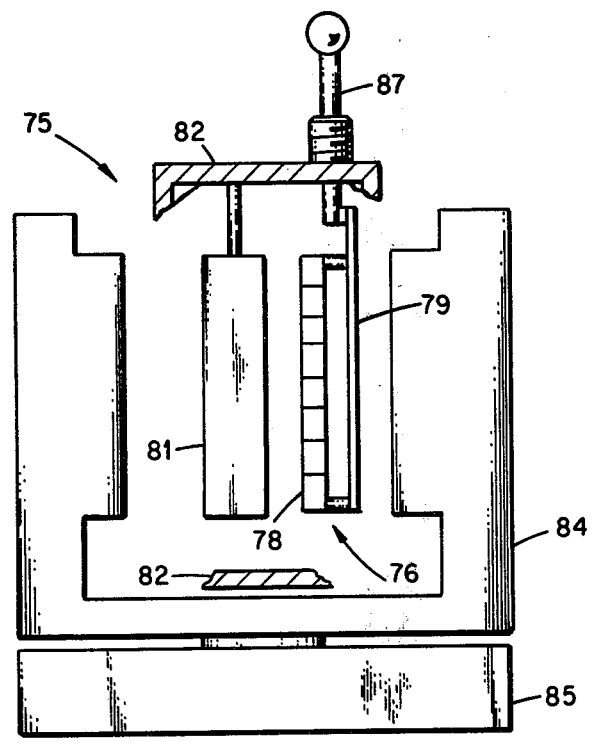
FIG. 4 is a representation of a crossed-field diode sputtering arrangement useful for ensuring deposition of uniform thin films on curved and irregular surfaces as well as flat surfaces.

In order to more uniformly deposit thin films on curved and irregular surfaces, as well as flat surfaces, an arrangement 75 (FIG. 4) is provided including a multiple cell diode array 76 including anode cells 78 and a cathode plate 79 for coating a substrate or workpiece 81 suspended from a sealed stationary enclosure 82. The workpiece 81 and array 76 are mounted in the gap of a magnet 84 which is rotatably mounted on a base 85.

Means such as a lever 87, extends through the sealed enclosure 82 to carry the array 76 for relative movement adjacent the surfaces of the workpiece 81 to more thoroughly and uniformly clean and coat the surfaces. The magnet 84 may be made rotatable for movement with the array 76 to maintain the field of the magnet coaxial with the anode cells 78.

Relative manipulation between the workpiece 81 and anode cells 78 is practical and simple since there are no DC or AC matching problems, and proximity of the workpiece 81 to the cells 78 is of no consequence in this respect as the workpiece need not be an element in the electrical circuit. To optimize coating uniformity, and/or thickness, the workpiece thus may be moved with respect to the anode cells. Additional examples of such use includes strips of flexible long length items such as wire, various types of chain, fabrics, and paper, which may be coated for various purposes, fed past the sputtering array 76 from rotating spool arrangements contained within the vacuum system. Also, smaller dimensional workpieces could be rotated or manipulated on platforms having several degrees of freedom. By the same token the array 76 may be conveniently manipulated to achieve the desired quantity and quality of substrate coating. Also, the anode cells 78 may be constructed of a large number of cells of differing geometry and moved with respect to the cathode 79 to achieve various desired coating effects of the workpiece which may or may not also be moving.

Another use of a multiple cell diode array, such as an array 89 (FIG. 5), is to sputter a thin film pattern onto a substrate 91, such as for a printed circuit board, by means of a mask 93 interposed between the array 89 and the substrate 91. Selection of the material of the cathode for the array 89 and selection of the gaseous atmosphere are the main parameters for determining the type of material to be deposited.

Masking in general may be used to obtain various substrate profiles outside or within cylinders, for example, or on flat substrates similar to printed circuits as described or decorative letter heads on stationery. As was mentioned, cells of differing configurations may be placed side by side in a massive gun array depending upon the particular application. If, for example, a particular stochiometry of materials is needed for particular substrate film characteristics, combined cell aspect ratios may be designed so as to optimize sputtering rate of respective materials being "mixed" or deposited on the substrate. Superconducting films is an application for this technique of "mixing" materials. Thus a composite cathode material may be simultaneously or sequentially sputtered to produce a composite coating of the workpiece. The composite cathode material inter alia may be for example strips of different materials, a mosaic of different materials or a homogenous mixture of different materials. Simultaneous sputtering would occur where the energy of the positive ions impinging on the cathode material equals or exceeds the threshold energy for sputtering all of the materials of the composite cathode. In instances where precious or very expensive materials are being sputtered simultaneously or independently onto a substrate surface, inserts 90 (FIG. 6) of the respective materials may be screwed (FIG. 6A) or pressed (FIG. 6B) into a cathode plate assembly made of less expensive materials. In that sputtering is localized on center of the respective anodes, it is not necessary that the entire cathode structure be made of the desired material to be sputtered onto the substrate thereby minimizing the cost of the expensive materials.

In FIG. 7 are shown front views of various alternative anode cell arrays including an array 95 (FIG. 7A) of cells of hexagonal cross section, an array 97 (FIG. 7B) of cylindrical cells, and an array 99 (FIG. 7C) of cells of square cross section. These configurations are representative only and other configurations may be used where convenient.

Only a few of the possible applications and advantages of the invention have been mentioned. Other possible applications include coating surfaces with special alloys and materials for purposes of increasing surface wear and hardness. Corrosion resistance of many materials could be greatly enhanced by judicious selection and deposition of materials onto the surfaces. Also solar heat radiation "traps" may be constructed by deposition of appropriate films onto transparent surfaces.

In another use of the invention, an anode cell 103 (FIG. 8) and cathode 105 may be arranged in an ionizable gaseous environment to be moved by means of a lever 107 to trace a desired pattern adjacent a substrate 109 and thereby to coat a thin film line on the substrate. Alternatively, the substrate 109 may be moved relative to the cell 103 or both the cell and substrate may be moved simultaneously to trace a pattern.

Another facet of the invention is the discovery that microwave components coated with titanium nitride have superior multipactor suppression characteristics over any prior coating material, in particular widely used coatings of titanium oxide. A microwave component such as a klystron window 110 (FIG. 9) may be coated with titanium nitride not only by means of the crossed-field diode arrangements described hereinbefore but by means such as an arrangement 111 including a titanium filament 113 heated by means of a voltage source 115 to an evaporative temperature in an environment of nitrogen to project titanium particles towards the window 110. The evaporated titanium chemically combines with the nitrogen as a titanium nitride coating on the window.

In operation of the described arrangements 48, 75, and 111 klystron windows have been coated with titanium oxide and titanium nitride by first evacuating the environment in which the windows are to be coated to a vacuum pressure of approximately $10^{-7}$ Torr, then refilling and maintaining the environment with 90% oxygen and 10% argon or 90% nitrogen and 10% argon to a pressure of $4 \times 10^{-5}$ to $5 \times 10^{-5}$ Torr, subjecting the arrangements 48 and 75 and the windows to a DC field of approximately 0.06 Tesla, applying a potential of approximately 2.5 KV to 3.5 KV to the anodes of the arrangements 48 and 75 for a coating period of from 1½ to 7.5 minutes per window side.

For a more extensive discussion of technical details for coating klystron windows, according to the invention, and test results for the windows, reference is made to (1) ERDA Technical Report No. SLAC-174, *New Materials and Technology for Suppressing Multipactor in High Power Microwave Windows*, by Kimo M. Welch, Stanford Linear Accelerator Center, Stanford University, Stanford, Calif. 94305, August 1974; and (2) ERDA TEchnical Report No. SLAC-PUB-1472, *Low Pressure Crossed Field Vacuum Sputtering of Thin Films for Multipactor Suppression Using a Simple Diode Array*, by Kimo M. Welch, Stanford Linear Accelerator Center, Stanford University, Stanford, Calif. 94305, August 1974.

While an embodiment of the invention has been shown and described, further embodiments or combinations of those described herein will be apparent to those skilled in the art without departing from the spirit of the invention.

What I claim is:

1. A microwave circuit component having a thin film coating of titanium nitride on the surface thereof to reduce multipactoring in operation of the component.
2. The microwave circuit component of claim 1 wherein the component is a klystron window.
3. The microwave circuit component of claim 1, wherein said coating is of a thickness ranging down to one molecular layer.
4. The microwave circuit component of claim 1, wherein said coating is a sputtered coating.